(12) United States Patent
Arakawa

(10) Patent No.: US 7,416,974 B2
(45) Date of Patent: Aug. 26, 2008

(54) METHOD OF MANUFACTURING SEMICONDUCTOR DEVICE, AND SEMICONDUCTOR DEVICE

(75) Inventor: Shinichi Arakawa, Kanagawa (JP)

(73) Assignee: Sony Corporation, Tokyo (JP)

(*) Notice: Subject to any disclaimer, the term of this patent is extended or adjusted under 35 U.S.C. 154(b) by 248 days.

(21) Appl. No.: 11/287,532

(22) Filed: Nov. 22, 2005

(65) Prior Publication Data

US 2006/0125100 A1 Jun. 15, 2006

(30) Foreign Application Priority Data

Dec. 10, 2004 (JP) ............................. P2004-358140

(51) Int. Cl.
*H01L 21/4763* (2006.01)
(52) U.S. Cl. .................. 438/637; 438/622; 438/648; 438/650; 257/774; 257/E21.332
(58) Field of Classification Search .......... 438/E21.332, 438/774, 637, 622, 648, 650; 257/637, E21.332, 257/774
See application file for complete search history.

(56) References Cited

U.S. PATENT DOCUMENTS 6,294,461 B1 * 9/2001 Thakur ...................... 438/637
6,555,465 B2 * 4/2003 Yamaha ..................... 438/624

* cited by examiner

*Primary Examiner*—Ha Nguyen
*Assistant Examiner*—Chakila Tillie
(74) *Attorney, Agent, or Firm*—Sonnenschein Nath & Rosenthal LLP

(57) ABSTRACT

A method of manufacturing a semiconductor device, comprising a first step of forming a layer insulation film on a lower layer wiring provided on a substrate and forming a connection hole in the layer insulation film, a second step of forming an alloy layer composed of a first metallic material constituting the lower layer wiring and a second metallic material different from the first metallic material, on the surface side of the lower layer wiring in the region to be a bottom portion of the connection hole, a third step of sputter-etching the alloy layer, and a fourth step of forming a via in the connection hole in the state of reaching the lower layer wiring; and the semiconductor device.

13 Claims, 15 Drawing Sheets

METHOD OF MANUFACTURING SEMICONDUCTOR DEVICE, AND SEMICONDUCTOR DEVICE

CROSS REFERENCES TO RELATED APPLICATIONS

The present invention contains subject matter related to Japanese Patent Application JP 2004-358140 filed with the Japanese Patent Office on Dec. 10, 2004, the entire contents of which being incorporated herein by reference.

BACKGROUND OF THE INVENTION

The present invention relates to a method of manufacturing a semiconductor device and a semiconductor device, particularly to a method of manufacturing a semiconductor device and a semiconductor device which are preferable for producing a multi-layer wiring structure by use of a copper (Cu) wiring.

In recent years, attendant on the enhancement of the degree of integration of semiconductor integrated circuit devices (LSIs), the wiring process technology in relation to the higher-speed operation of the LSIs has become deemed more and more important. This is because the increase in the wiring delay time has become conspicuous due to miniaturization of semiconductor devices. For suppressing the increase in the wiring delay time, it is desirable to reduce the wiring resistance and the inter-wiring capacity.

In regard of the reduction in the wiring resistance, investigations have been made of the copper (Cu) wiring which is lower in resistance, as compared with the aluminum alloy wiring which has hitherto been used. On the other hand, in regard of the reduction in the inter-wiring capacity, investigations have been made of insulation films lower in dielectric constant (lower dielectric constant films) as compared with silicon oxide which has hitherto been used as a layer insulation film. It is considered important to introduce a multi-layer wiring structure using a Cu wiring and a low dielectric constant film.

The multi-layer wiring structure as above-mentioned is generally formed by a trench wiring method such as the dual Damascene process (see, for example, G. B. Alers, Electromigration Improvement with PDL TiN(Si) Barrier in Copper Dual Damascene Structure, "INTERNATIONAL RELIABILITY PHYSICS SYMPOSIUM PROCEEDINGS", (USA) IEEE, 2002). In such a multi-layer wiring structure, the via is used in the case of connecting upper and lower wirings; in many cases, generally, a structure is adopted in which the via bites into the lower layer wiring side (see, for example, Jason Gill, Investigation of Via-Dominated Multi-Modal Electromigration Failure Distributions in Dual Damascene Cu Interconnects with Discussion of the Statistical Implication, "INTERNATIONAL RELIABILITY PHYSICS SYMPOSIUM PROCEEDINGS", (USA) IEEE, 2003). Such a structure is called as an anchor structure, which can conduct the reduction of the wiring resistance by increasing the region of joint between the lower layer wiring and the via.

Here, one example of the method of producing a multi-layer wiring structure in which an anchor structure is formed by use of the dual Damascene process will be described referring to FIGS. 8A to 8B. As shown in FIG. 8A, a lower wiring 15 composed of Cu is provided on the upper side of a wiring trench 13 provided in a layer insulation film 12 on a substrate 11, with a barrier film 14 therebetween. An etching stopper film 16 composed of silicon carbonitride (SiCN) is formed in the condition of covering the lower layer wiring 15 and the layer insulation film 12, and thereafter a low dielectric constant film composed of methyl hydrogen silsesquioxane (MSQ) is formed as a layer insulation film 17 on the etching stopper film 16. Next, a resist mask R provided with a connection hole pattern is formed on the layer insulation film 17 by an ordinary lithographic technique.

Subsequently, as shown in FIG. 8B, etching is conducted using the resist mask R, whereby the layer insulation film 17 is provided with a connection hole 18 reaching the etching stopper film 16. Thereafter, the resist mask R is removed.

Next, as shown in FIG. 8C, a resist mask (omitted in the figure) provided with a wiring trench pattern is formed on the layer insulation film 17 by an ordinary lithographic technique, and thereafter the layer insulation film 17 is provided with a wiring trench 19 in the state of being communicated with the connection hole 18, by etching using the resist mask. Thereafter, the etching stopper film 16 exposed at a bottom portion of the connection hole 18 is removed, whereby the surface of the lower wiring 15 is exposed.

Subsequently, as shown in FIG. 8D, by sputter etching using Ar, the surface side of the lower wiring 15 exposed at the bottom portion of the connection hole 18 is dug, thereby causing the connection hole 18 to reach the inside of the lower wiring 15.

Next, as shown in FIG. 8E, a barrier film 20 is formed on the layer insulation film 17 in the condition of covering the inside walls of the connection hole 18 and the wiring trench 19.

Next, as shown in FIG. 8F, a wiring material film 21 composed of Cu is formed on the barrier film 20 in the condition of filling up the connection hole 28 and the wiring trench 19 provided with the barrier film 20. Subsequently, a heat treatment is carried out, to cause crystal growth of Cu in the wiring material film 21.

Subsequently, as shown in FIG. 9, the wiring material film 21 (see FIG. 1F) and the barrier film 20 are removed by a chemical mechanical polishing (CMP) process until the surface of the layer insulation film 17 is exposed, thereby forming an upper layer wiring 22 in the wiring trench 19 and forming a via 23 in the connection hole 18. As a result, the via 23 is provided in the state of reaching the inside of the lower layer wiring 15, whereby an anchor structure in the condition where the via 23 bites into the lower wiring layer 15 is formed.

In addition, other than the manufacturing method described using FIGS. 8 to 9, a manufacturing method as follows is also carried out generally. First, as has been described using FIG. 8C, the procedure up to the step of removing the etching stopper film 16 at the bottom portion of the connection hole 18 to thereby expose the surface side of the lower wiring 15 is carried out in the same manner as in the above-described manufacturing method. Next, as shown in FIG. 10A, a first barrier layer 20a is formed on the layer insulation film 17 in the state of covering the inside walls of the wiring trench 19 and the connection hole 18.

Subsequently, as shown in FIG. 10B, by sputter etching using Ar, the first barrier layer 20a at the bottom portion of the connection hole 18 is removed, and the surface side of the lower layer wiring 15 is dug, thereby causing the connection hole 18 to reach the inside of the lower layer wiring 15.

Thereafter, as shown in FIG. 10C, a second barrier layer 20b is formed on the first barrier layer 20a in the state of covering the inside walls of the wiring trench 19 and the connection hole 18, thereby forming a barrier film 20 composed of the first barrier layer 20a and the second barrier layer 20b. The subsequent steps are carried out in the same manner as in the manufacturing method described above referring to FIGS. 8F to 9.

SUMMARY OF THE INVENTION

However, in the method of manufacturing a semiconductor device as has been described referring to FIGS. 8 to 9, in the step described using FIG. 8D, the surface side of the lower wiring 15 at the bottom portion of the connection hole 18 is dug by physical sputter etching, so that Cu constituting the lower wiring 15 is scatted around onto the side wall of the connection hole 18, as shown in FIG. 11A which is an enlarged diagram of region C in FIG. 11D. The scattered matter 15' is elemental Cu and, is liable to aggregate; as a result of the aggregation, recesses and projections are generated in the side wall of the connection hole 18.

Therefore, in the case of forming the barrier film 20 in the state of covering the inside wall of the connection hole 18, as shown in FIG. 11B, the presence of the recesses and projections due to the aggregation of the scattered matter 15' makes it difficult to form the barrier film 20 with good coverage. Accordingly, due to the bad coverage of the barrier film 20, there has been the problems of generation of voids V and a lowering of adhesion between the barrier film 20 and the layer insulation film 17.

In addition, since the layer insulation film 17 constituting the side wall of the connection hole 18 is formed of a low dielectric film composed of MSQ and has a film structure containing many methyl groups, the methyl groups exposed on the side wall of the connection hole 18 are broken by the plasma at the time of processing the connection hole 18. Therefore, the thus damaged portions are liable to absorb moisture, and the scattered Cu tends to be oxidized easily. This makes it difficult to grow the barrier film 20 on the oxidized scatted matter 15'; due to this, there has been the problem of generation of bad coverage of the barrier film 20.

As a result, as shown in FIG. 11C, in the step of carrying out the heat treatment after the formation of the wiring material film 21 on the barrier film 20 in the state of filling up the wiring trench 19 and the connection hole 18, formation of a large void V' would arise from bad-adhesion portions or small voids V (see FIG. 11B), due to the wick-up of Cu. Accordingly, there has been the problem that the reliability of the wiring is worsened, for example, electromigration (EM) resistance and stress migration (SM) resistance are worsened, and, further, conduction failure occurs. This tendency is observed more conspicuously as the device becomes minuter and the connection hole 18 becomes smaller in diameter. This has come to be a serious problem.

Besides, in the manufacturing method described using FIGS. 10A to 10C, the surface side of the lower layer wiring 15 is dug after the formation of the first barrier layer 20 in the state of covering the inside wall of the connection hole 18, with the result that the scattered matter 15' is deposited on the first barrier layer 20a, as shown in FIG. 12. Therefore, the scatted matter 15' is not deposited on the layer insulation film 17 constituting the side wall of the connection hole 18, so that the lowering of the adhesion between the layer insulation film 17 and the first barrier layer 20a is improved. However, due to the aggregation of the scattered matter 15' deposited on the first barrier layer 20a, recessed and projections are generated in the surface of the first barrier layer 20a, and bad coverage of the second barrier layer 20b is generated. In addition, since the layer insulation film 17 exposed at the side wall of the connection hole 18 is liable to absorb moisture, the first barrier layer 20a formed in the state of covering the inside wall of the connection hole 18 is liable to be oxidized. Therefore, with the scattered matter 15' deposited on the first barrier layer 20a, the oxidation of the scattered matter 15' also makes it difficult to grow the second barrier layer 20b; due to this, there has been the problem of bad coverage of the second barrier layer 20b.

As a result, generation of voids V and a lowering in the adhesion between the first barrier layer 20a and the second barrier layer 20b arise from the bad coverage of the second barrier layer 20b. Therefore, even in this manufacturing method, the above-mentioned problems have been generated, although the problems are somewhat improved by the formation of the first barrier layer before the sputter etching, as compared with the case of the manufacturing method described referring to FIGS. 8 to 9.

In order to solve the above problems, a first method of manufacturing a semiconductor device according to an embodiment of the present invention includes the following steps carried out sequentially. First, in a first step, an insulation film is formed on a substrate in the state of covering a wiring provided on the substrate, and a connection hole is formed in the insulation film. Next, in a second step, an alloy layer composed of a first metallic material constituting the wiring and a second metallic material different from the first metallic material is formed on the surface side of the wiring in a region to be a bottom portion of the connection hole. Subsequently, in a third step, the alloy layer is sputter etched, and in the following fourth step, a via is formed in the connection hole in the state of reaching the wiring.

According to this method of manufacturing a semiconductor device, the alloy layer is formed on the surface side of the wiring to be the bottom portion of the connection hole and sputter etching is applied to the surface of the alloy layer, so that the alloy is scattered and deposited on the side wall of the connection hole. As a result of this, and because aggregation of an alloy is generally less liable to occur than the aggregation of elemental Cu, generation of recesses and projections in the side wall of the connection hole due to the aggregation of a scattered matter is suppressed, as compared with the case where elemental Cu is scattered. Therefore, in the case of forming the barrier film on the layer insulation film in the state of covering the inside wall of the connection hole, bad coverage of the barrier film is prevented from occurring due to recesses and projections in the side wall of the connection hole. This ensures that generation of voids and a lowering in the adhesion between the barrier film and the layer insulation film due to the bad coverage is restrained. In addition, since the alloy is less liable to be oxidized as compared with elemental Cu, the barrier film is sufficiently grown on the alloy, which also ensures that the bad coverage of the barrier film is restrained.

Besides, in the case where the alloy layer is left on the surface side of the wiring in applying sputter etching to the surface of the alloy layer in the third step, the alloy layer is left provided in the region of joint between the surface side of the wiring and the via. This ensures that, since the alloy layer is high in EM durability and SM durability, migration of the wiring material is suppressed, and the EM durability and SM durability can be enhanced.

A second method of manufacturing a semiconductor device according to another embodiment of the present invention includes the following steps carried out sequentially. First, in a first step, a mask provided with a connection hole pattern is formed on a substrate in the state of covering a wiring provided on the substrate, and an alloy layer composed of a first metallic material constituting the wiring and a second metallic material different from the first metallic material is formed on the surface side of the wiring exposed from the mask. Next, in a second step, an insulation film is formed on the wiring deprived of the mask or on the mask inclusive of the area on the wiring, and the insulation film is provided with a connection hole in the state of reading the alloy layer. Subsequently, in a third step, the alloy layer is sputter etched, and in the following fourth step, a via is formed in the connection hole in the state of reaching the wiring.

According to this method of manufacturing a semiconductor device, the alloy layer is formed on the surface side of the wiring exposed from the mask provided with the connection hole pattern, the insulation film formed on the wiring deprived of the mask or on the mask inclusive of the area on the wiring, and thereafter the alloy layer is sputter etched, so that the alloy is scattered and deposited on the side wall of the connection hole. This ensures that, because an alloy is generally less liable to aggregate than elemental Cu, generation of recesses and projections in the side wall of the connection hole due to aggregation of the scattered matter is restrained, as compared with the case where elemental Cu is scattered. Therefore, in the case of forming the barrier film on the layer insulation film in the state of covering the inside wall of the connection hole, bad coverage of the barrier film is restrained from being generated due to recesses and projections in the side wall of the connection hole. This ensures that generation of voids and a lowering in the adhesion between the barrier film and the layer insulation film are prevented from arising from bad coverage of the barrier film. Besides, since the alloy is less liable to be oxidized as compared with elemental Cu, the barrier film is sufficiently grown on the alloy, which also ensures that bad coverage of the barrier film is prevented.

Besides, in the case where the alloy layer is left on the surface side of the wiring in sputter-etching the alloy layer in the third step, the alloy is left provided in the region of joint between the surface side of the wiring and the via. This ensures that, since the alloy layer is high in EM durability and SM durability, migration of the wiring material is suppressed, and the EM durability and SM durability can be enhanced.

A semiconductor device according to a further embodiment of the present invention includes a wiring provided on a substrate, an insulation film provided on the substrate in the state of covering the wiring, and a via provided in the inside of the connection hole provided on the insulation film, in the state of reaching the wiring. In addition, an alloy layer composed of a first metallic material constituting the wiring and a second metallic material different from the first metallic material is provided on the surface side of the wiring, selectively in the region of joint to the via.

Such a semiconductor device is produced by the above-described method of manufacturing a semiconductor device. In addition, since the ally layer is provided on the surface side of the wiring selectively in the region of joint to the via, migration of the wiring material is restrained, and EM durability and SM durability can be enhanced.

As has been described above, according to the method of manufacturing a semiconductor device and the semiconductor device obtained by the method according to the present invention, generation of small voids and a lowering in the adhesion between the barrier film and the layer insulation film are prevented from occurring due to bad coverage, so that it is possible to prevent generation of a large void in the via due to the small voids or the lowering in adhesion, by the heat treatment after the formation of the via in the connection hole. In addition, EM durability and SM durability can be enhanced. Therefore, reliability of the wiring structure can be enhanced, and, hence, it is possible to realize a high-performance CMOS device and to remarkably enhance the performance of a computer, a game machine, a mobile product or the like.

DETAILED DESCRIPTION OF THE PREFERRED EMBODIMENTS

Figure 1A:
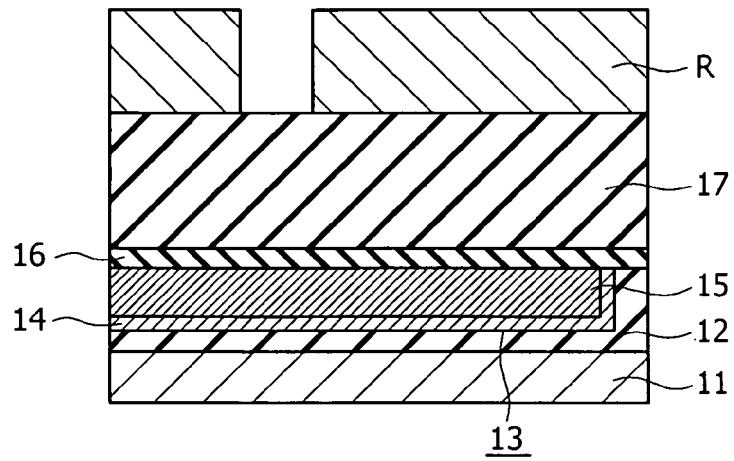
FIGS. 1A to 1C are manufacturing step sectional diagrams (No. 1) for illustrating a first embodiment of the method of manufacturing a semiconductor device according to the present invention.

Now, some embodiments of the present invention will be described in detail below referring to the drawings.

First Embodiment

An embodiment of the method of manufacturing a semiconductor device according to the present invention will be described referring to manufacturing step sectional diagrams shown in FIG. 1. In this embodiment, a method of producing a multi-layer wiring structure composed of Cu and a low dielectric constant film by use of the dual Damascene process will be described. Incidentally, the same components as in the method of manufacturing a semiconductor device described in the Background of the Invention are denoted by the same reference symbols as used above.

As shown in FIG. 1A, a layer insulation film 12 composed of $SiO_2$, for example, is formed on a semiconductor substrate (substrate) 11 provided with a semiconductor device such as a transistor. Thereafter, a wiring trench 13 is formed in the layer insulation film 12, and a lower layer wiring 15 composed of Cu, for example, is formed in a film thickness of 200 nm on the upper side thereof, with a barrier film 14 therebetween. In this case, Cu constituting the lower layer wiring 15 corresponds to the first metallic material set forth in the claims.

Next, an etching stopper film 16 composed of SiCN, for example, is formed in a thickness of 50 nm on the layer insulation film 12 inclusive of the area on the lower layer wiring 15 by a plasma enhanced chemical vapor deposition (PE-CVD) process. Next, a layer insulation film 17 composed of MSQ, for example, is formed in a thickness of 500 nm on the etching stopper film 16 by, for example, a coating method or a CVD method. The MSQ is a porous low dielectric constant film having a dielectric constant of not more than 3.

Subsequently, a chemically amplified ArF resist, for example, is applied to the layer insulation film 17, and thereafter a connection hole pattern with a diameter of 140 nm, for example, is formed by an ordinary lithographic technique, to form a resist mask R.

Figure 1B:
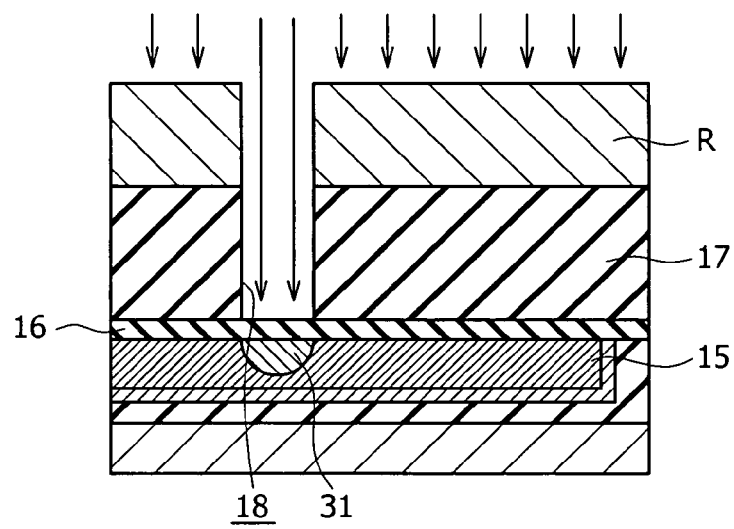

Next, as shown in FIG. 1B, with the resist mask R as a mask, plasma etching using a fluorocarbon (CF) based gas is conducted to provide the layer insulation film 17 with a connection hole 18 in the state of reaching the etching stopper film 16. Here, since the layer insulation film 17 consists of the low dielectric constant film composed of MSQ, it has a film structure containing many methyl groups; therefore, the methyl groups exposed at the side wall of the connection hole 18 are broken by the plasma at the time of processing the connection hole 18. Accordingly, the thus damaged portion is liable to absorb moisture.

Subsequently, by an ion implantation process, for example, and by using the resist mask R as a mask, a metallic material different from Cu constituting the lower layer wiring 15 is introduced to the surface side of the lower layer wiring 15, through the etching stopper film 16 exposed at a bottom portion of the connection hole 18. This metallic material corresponds to the second metallic material set forth in the claims. As a result, an alloy layer 31 is formed on the surface side of the lower layer wiring 15 at the bottom portion of the connection hole 18.

Here, the metallic material introduced to the surface side of the lower layer wiring 15 is not particularly limited, inasmuch as it is different from the metallic material constituting the lower layer wiring 15. It should be noted here, however, that it is preferable to use a metallic material contained in the barrier film which is to be formed in the state of covering the inside wall of the connection hole 18 in a later step. With such a metallic material used, an alloy will be scattered onto the side wall of the connection hole 18 during sputter-etching of an alloy layer 31 in a later step. However, the barrier film containing the same material as the scattered matter is thereafter formed in the state of covering the inside wall of the connection hole 18, whereby the lowering in the adhesion between the layer insulation film 17 and the barrier film is restrained, as compared with the case where the scattered matter is elemental Cu, as has been described in the Background of the Invention. Examples of such a metallic material include tantalum (Ta), titanium (Ti), tungsten (W), cobalt (Co), silver (Ag), lead (Pb), aluminum (Al), silicon (Si), boron (B), tin (Sn), indium (In), magnesium (Mg), nickel (Ni), zirconium (Zr), and ruthenium (Ru).

Here, Ta is introduced to the surface side of the lower layer wiring 15 by ion implantation under the conditions of a dose of $5\times10^{13}$ and an acceleration voltage of 5 keV, whereby an alloy layer 31 composed of a CuTa alloy is formed in a film thickness of 30 nm on the surface side of the lower layer wiring 15 at the bottom portion of the connection hole 18. The proportion of the second metallic material in the alloy layer 31 is appropriately set at such a proportion that, at the time of sputter etching conducted in a later step, the matter scattered from the alloy layer 31 onto the side wall of the connection hole 18 would not aggregate.

Figure 1C:
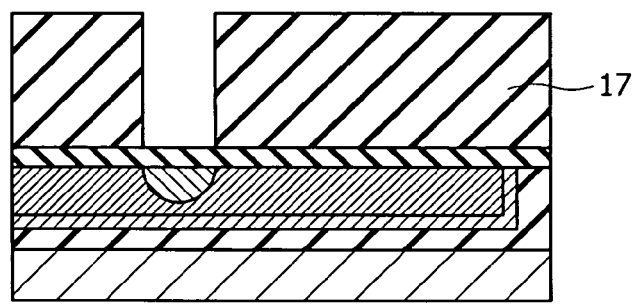

Thereafter, as shown in FIG. 1C, by ashing conducted using an oxygen-based gas such as $O_2$, the resist mask R (see FIG. 1B) is removed. In this instance, for minimizing the plasma damage to the layer insulation film 17 composed of the low dielectric constant film, it is preferable to conduct the ashing under a low pressure condition; here, the pressure is 2.7 Pa.

Figure 1D:
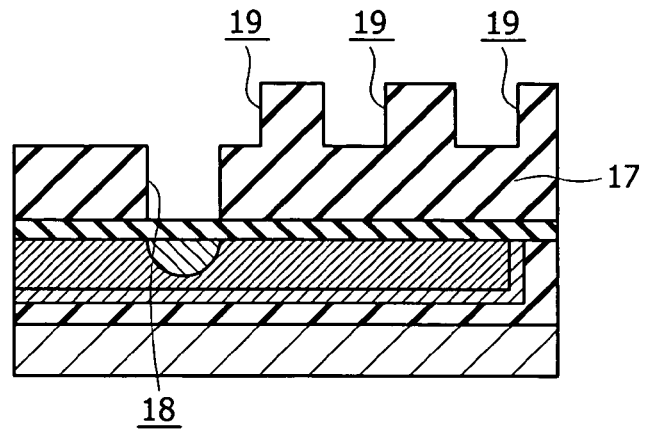
FIGS. 1D to 1F are manufacturing step sectional diagrams (No. 2) for illustrating the first embodiment of the method of manufacturing a semiconductor device according to the present invention.

Next, as shown in FIG. 1D, the chemically amplified ArF resist is again applied to the layer insulation film 17, and a resist mask (omitted in the figure) provided with a wiring trench pattern is formed by an ordinary lithographic technique. Thereafter, the layer insulation film 17 is provided with a wiring trench 19 having a depth of 250 nm and communicated with the connection hole 18, by dry etching conducted using a CF-based gas. Subsequently, in the same manner as the above-mentioned resist mask R, the resist mask is removed by ashing conducted under a low pressure condition using an $O_2$-based gas.

Figure 1E:
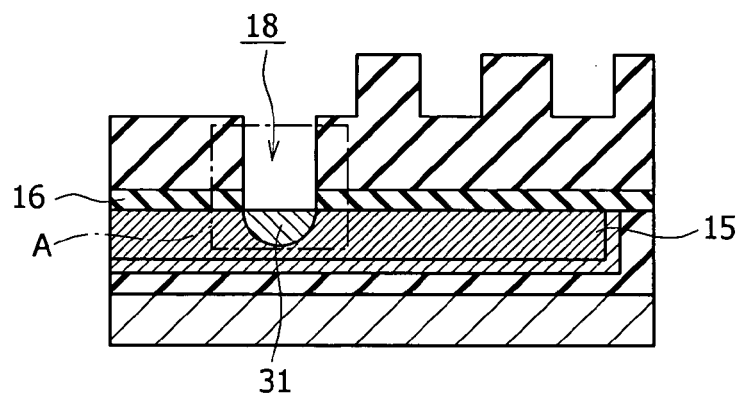

Next, as shown in FIG. 1E, the etching stopper film 16 exposed at the bottom portion of the connection hole 18 is etched away, to expose the alloy layer 31 provided on the surface side of the lower layer wiring 15. Subsequently, the surface of the alloy layer 31 thus exposed is cleaned with an organic cleaning liquid.

Figure 1F:
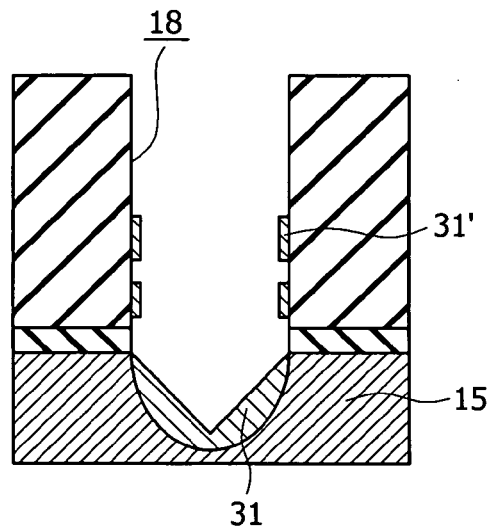

Next, as shown in FIG. 1F which is an enlarged diagram of region A of FIG. 1E, the alloy layer 31 is dug down to a depth of 20 nm by sputter etching conducted using Ar, to cause the connection hole 18 to reach the inside of the lower layer wiring 15. By this, the region on the surface side of the lower layer wiring 15 for joint to a via to be formed in the connection hole 18 in a later step is cleaned, and the area of contact between the lower layer wiring 15 and the via is increased through digging of the alloy layer 31. Then, the sputter etching is finished in the condition where the alloy layer 31 is left on the surface side of the lower layer wiring 15 at the bottom portion of the connection hole 18.

Here, during the sputter etching, the CuTa alloy constituting the alloy layer 31 is scattered and deposited on the side wall of the connection hole 18. The scattered matter 31', being an alloy, is restrained from aggregation and, therefore, generation of recesses and projections in the side wall of the connection hole 18 is restrained, as compared with the case where elemental Cu is scattered. In addition, with the CuTa alloy scattered, oxidation of the scattered matter 31' is restrained even when it is deposited on the layer insulation film 17 having absorbed moisture, as compared with the case where elemental Cu is scattered.

Incidentally, while the alloy layer 31 is left on the surface side of the lower layer wiring 15 at the bottom portion of the connection hole 18 here, the present invention is not limited to this configuration; for example, the alloy layer 31 may be completely removed by the sputter etching. It should be noted, however, that leaving the alloy layer 31 is preferable, since it is thereby possible to suppress the migration of Cu constituting the lower layer wiring 15 and to enhance EM durability and SM durability.

Figure 1G:
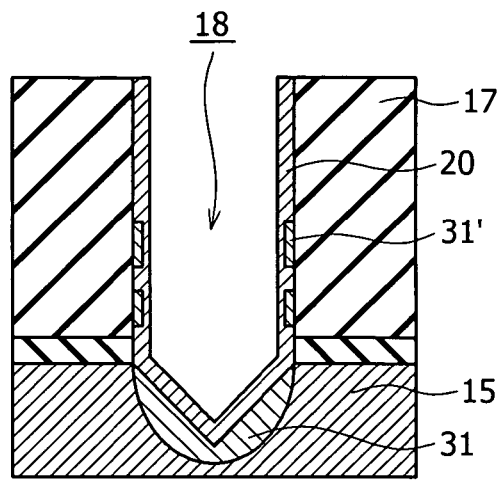
FIGS. 1G to 1I are manufacturing step sectional diagrams (No. 3) for illustrating the first embodiment of the method of manufacturing a semiconductor device according to the present invention.

Next, as shown in FIG. 1G, a barrier film 20 composed of a lamination of tantalum nitride (TaN) and Ta in this order is formed in a thickness of 15 nm on the layer insulation film 17 in the state of covering the inside walls of the wiring trench 19 (see FIG. 1E) and the connection hole 18 by, for example, a sputtering method or a CVD method. In this case, while the barrier film 20 is formed on the inside wall of the connection hole 18 in the state of covering the scattered matter 31', the side wall of the connection hole 18 is in the condition where generation of recesses and projections therein due to the scattered matter 31' is restrained, and oxidation of the scattered matter 31' is prevented; therefore, the growth of the barrier film 20 is not hindered, the barrier film 20 is grown on the inside wall of the connection hole 18 with good coverage, and adhesion of the barrier film 20 is also enhanced.

In addition, since the material constituting the scattered matter 31' and the barrier film 20 both contain the same material (Ta), the adhesion between the barrier film 20 and the layer insulation film 17 is prevented from being lowered, as has been described above. Incidentally, the barrier film 20 functions as an anti-diffusion film for preventing Cu from diffusing from an upper layer wiring and a via, which are formed in the wiring trench 19 and the connection hole 18 and which are formed of Cu, into the layer insulation film 17 in a later step.

Figure 1H:
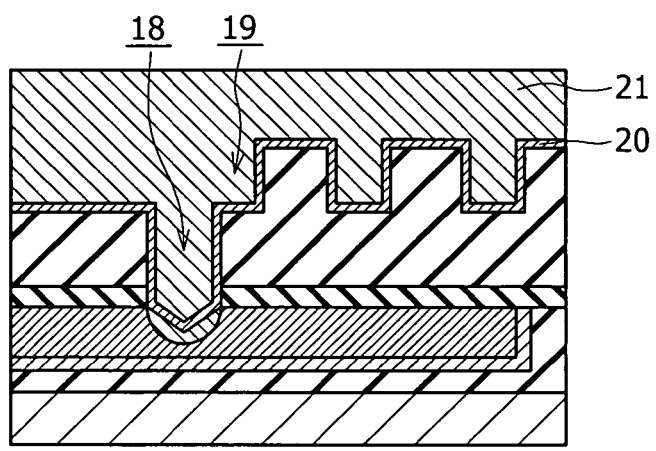

Thereafter, as shown in FIG. 1H, a seed layer (omitted in the diagram) composed of Cu is formed on the barrier film 20 by, for example, a sputtering method or a CVD method, and then a wiring material film 21 composed of Cu is formed on the barrier film 20 in the state of filling up the wiring trench 19 and the connection hole 18 by an electrochemical plating (ECP) method or a CVD method. Thereafter, a heat treatment for crystal growth of Cu is carried out.

Figure 1I:
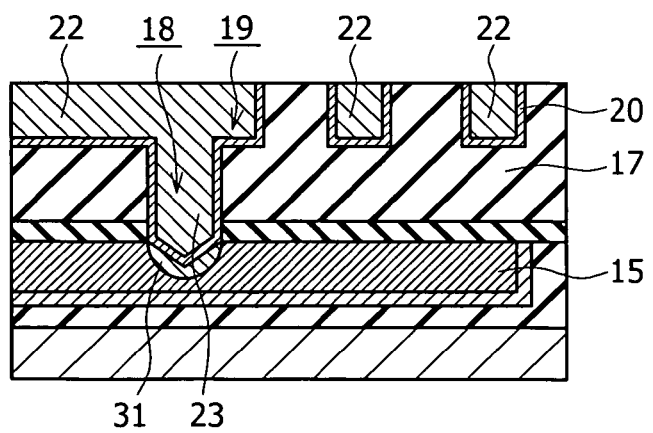

Subsequently, as shown in FIG. 1I, the wiring material film 21 (see FIG. 1H) and the barrier film 20 are removed by, for example, a CMP method until the surface of the layer insulation film 17 is exposed, whereby the upper layer wiring 22 is formed on the wiring trench 19 and the via 23 is formed in the connection hole 18. In this case, since the connection hole 18 is formed in the state of reaching the inside of the lower layer wiring 15 as above-described, the via 23 formed in the connection hole 18 is provided in the state of reaching the inside of the lower layer wiring 15, resulting in an anchor structure in which the via 23 bites into the lower layer wiring 15. In addition, the alloy layer 31 is provided on the surface side of the lower layer wiring 15 selectively in the region of joint to the via 23.

The subsequent steps, ranging from the step of forming the etching stopper film 16 described using FIG. 1A to the step of forming the upper layer wiring 22 to the via 23 described using FIG. 1I, are repeatedly conducted to thereby produce a multi-layer wiring structure.

According to the method of manufacturing a semiconductor device and the semiconductor device as above, the alloy layer 31 composed of CuTa is formed on the surface side of the lower layer wiring 15 at the bottom portion of the connection hole 18, and the alloy layer 31 is sputter etched, resulting in the condition where the scattered matter 31' composed of the CuTa alloy is deposited on the side wall of the connection hole 18. This ensures that, since the CuTa alloy is less liable to aggregate than Cu, the recesses and projections generated in the side wall of the connection hole 18 due to the aggregation of the scattered matter 31' are suppressed, as compared with the case where elemental Cu is scattered. Therefore, in the case of forming the barrier film 20 on the layer insulation film 17 in the state of covering the inside wall of the connection hole 18, bad coverage of the barrier film 20 due to the recesses and projections in the side wall of the connection hole 18 is prevented from occurring. This ensures that generation of voids and a lowering in the adhesion between the barrier film 20 and the layer insulation film 17 are prevented from occurring due to bad coverage of the barrier film 20.

Besides, since the CuTa alloy is less liable to be oxidized than elemental Cu, oxidation of the scattered matter 31' is prevented even when the scattered matter 31' is deposited on the layer insulation film 17 which is liable to absorb moisture. As a result, bad coverage of the barrier film 20 is prevented also by the sufficient growth of the barrier film 20 on the scattered matter 31'.

Therefore, by the heat treatment after the formation of the via 23 in the connection hole 18, generation of a large void due to the voids present in the via 23 and the lowering in the adhesion between the barrier film 20 and the layer insulation film 17 is prevented.

In addition, as has been described using FIG. 1G, the alloy layer 31 is left in sputter etching of the surface of the alloy layer 31 exposed at the bottom portion of the connection hole 18, so that, as a result, the alloy layer 31 is provided on the surface side of the lower layer wiring 15 selectively in the region of joint to the via 23. This ensures that, since the alloy layer 31 is higher than elemental Cu in EM durability SM durability, migration of Cu constituting the lower layer wiring 15 is restrained, and the EM durability and SM durability can be enhanced. Besides, with the alloy layer 31 formed only in the region of joint of the lower layer wiring 15 to the via 23, the above-mentioned effects can be displayed while suppressing the wiring resistance in an allowable range, as compared with the case where the alloy layer 31 is provided over the entire region on the surface side of the wiring 15.

From the foregoing, EM durability and SM durability can be enhanced without causing generation of voids in the via 23, so that reliability of the wiring structure can be enhanced. Therefore, it is possible to realize a high-performance CMOS device, and to remarkably enhance the performance of a computer, a game machine, a mobile product or the like.

Further, according to this embodiment, the same material (Ta) is used in both the metallic material introduced into the lower layer wiring 15 for the purpose of constituting the alloy layer 31 and the metallic material constituting the barrier film 20, so that a condition is obtained in which the scattered matter 31' is deposited on the side wall of the connection hole 18 contains the same material as that contained in the barrier film 20. This ensures that the lowering in the adhesion between the barrier film 20 and the layer insulation film 17 constituting the side wall of the connection hole 18 is restrained, as compared with the case where elemental Cu is scattered as has been described in the Background of the Invention.

In addition, the resist mask R used as a mask in forming the connection hole 18 in the layer insulation film 17 is used also as a mask at the time of ion implantation, whereby the alloy layer 31 can be formed without increasing the number of intricate lithographic steps; thus, excellent productivity is obtained.

Incidentally, as has been described using FIG. 1B, the ion implantation of the metallic material to the surface side of the lower layer wiring 15 is conducted through the etching stopper film 16 in this embodiment, but the present invention is not limited to this; for example, the ion implantation may be carried out after the formation of the connection hole 18 and the removal of the etching stopper film 16 from the bottom portion of the connection hole 18. It should be noted in this case that the alloy layer 31 at the bottom portion of the connection hole 18 is left exposed until the barrier film 20 is formed in a later step, so that the barrier film 31 is liable to damage. Therefore, it is preferable to conduct the ion implantation in the condition where the etching stopper film 16 is provided. In addition, as has been described referring to FIG. 1E, the ion implantation to the surface of the lower layer wiring 15 exposed at the bottom portion of the connection hole 18 may be carried out after the removal of the etching stopper film 16 from the bottom portion of the connection hole 18 after the formation of the wiring trench 19. In this case, since the layer insulation film 17 serves as a mask, a condition is obtained in which the metallic material is introduced also into the layer insulation film 17. In view of this, the ion implantation amount is controlled to such an amount as not to cause a problem, for example, generation of a leak current.

MODIFIED EXAMPLE 1

Figure 2:
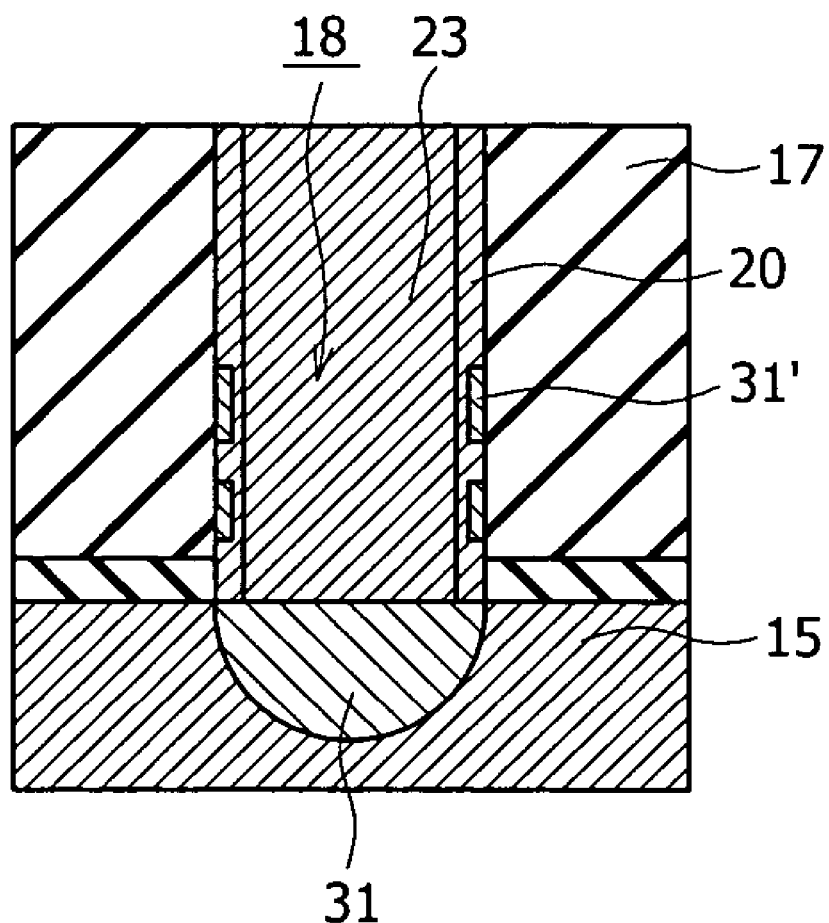
FIG. 2 is a sectional diagram for illustrating Modified Example 1 of the first embodiment of the method of manufacturing a semiconductor device according to the present invention.

In the above first embodiment, description has been made of an example in which the alloy layer 31 is dug by sputter etching, whereby an anchor structure is produced in which the via 23 formed in the connection hole 18 bites into the lower layer wiring 15. However, the present invention is not limited to this example. For example, the present invention is applicable also to the case where, as shown in FIG. 2, the connection hole 18 is formed in the state of reaching the surface of the alloy layer 31, and the via 23 formed in the connection hole 18 does not have the anchor structure. Even in this case, the surface of the alloy layer 31 is cleaned by subjecting the surface of the alloy layer 31 to sputter etching conducted using Ar, before the step of forming the barrier film 20 on the inside wall of the connection hole 18, so that the scattered matter 31' composed of the CuTa alloy is deposited on the side wall of the connection hole 18.

Therefore, even in such a case, the aggregation and oxidation of the scattered matter 31' are restrained, so that the barrier film 20 can be formed with good coverage. In addition, with the alloy layer 31 provided on the surface side of the lower layer wiring 15 in the region of joint to the via 23, EM durability and SM durability can be enhanced. Accordingly, the same effects as in the first embodiment can be displayed.

Second Embodiment

In the next place, a second embodiment of the method of manufacturing a semiconductor device according to the present invention will be described referring to manufacturing step sectional diagrams shown in FIGS. 3A to 3C. Incidentally, the same components as in the first embodiment are denoted by the same reference symbols as used above, and detailed description thereof is omitted. In addition, the steps up to the step of providing the layer insulation film 17 with the wiring trench 19 in the condition of being communicated with the connection hole 18 and then removing the etching stopper film 16 from the bottom portion of the connection hole 18, as has been described using FIG. 1E, are conducted in this embodiment in the same manner as in the first embodiment.

Figure 3A:
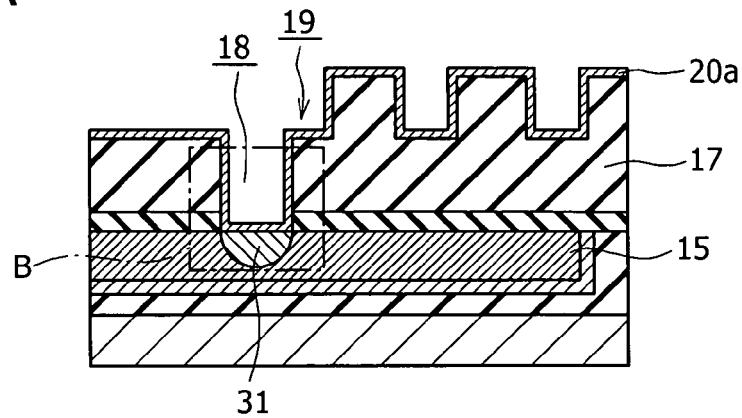
FIGS. 3A to 3C are manufacturing step sectional diagrams for illustrating a second embodiment of the method of manufacturing a semiconductor device according to the present invention.

First, as shown in FIG. 3A, a first barrier layer 20a composed of TaN, for example, is formed in a film thickness of 10 nm on the layer insulation film 17 in the state of covering the inside walls of the wiring trench 19 and the connection hole 18. In this instance, the layer insulation film 17 constituting the side wall of the connection hole 18 is liable to absorb moisture due to the damage by the plasma, so that the first barrier layer 20a is liable to be oxidized.

Figure 3B:
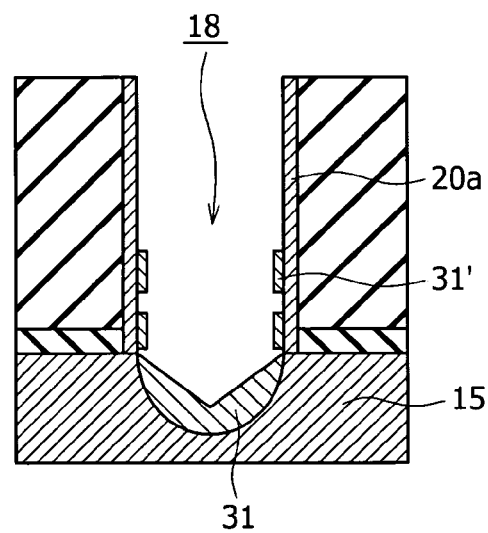

Next, as shown in FIG. 3B which is an enlarged diagram of region B shown in FIG. 3A, by sputter etching conducted using Ar, the first barrier layer 20a is removed and an alloy layer 31 is dug down to a depth of 20 nm, thereby causing the connection hole 18 to reach the inside of a lower layer wiring 15. Then, the sputter etching is finished in the condition where the alloy layer 31 is left on the surface side of the lower layer wiring 15 at a bottom portion of the connection hole 18. As a result, a condition is obtained in which the first barrier layer 20a is left only on the side wall of the connection hole 18.

Here, during the sputter etching, a CuTa alloy constituting the alloy layer 31 is scattered, and the scattered matter 31' is deposited on the first barrier layer 20a in the state of covering the side wall of the connection hole 18. In this case, since the scattered matter 31' is an alloy, aggregation of the scattered matter 31' is prevented and generation of recesses and projections in the side wall of the connection hole 18 is restrained, as compared with the case where elemental Cu is scattered. In addition, with the CuTa alloy is scattered, it is ensured that even if the scattered matter 31' is deposited on the first barrier layer 20a which has been oxidized, oxidation of the scattered matter 31' is restrained, as compared with the case where elemental Cu is scattered.

Figure 3C:
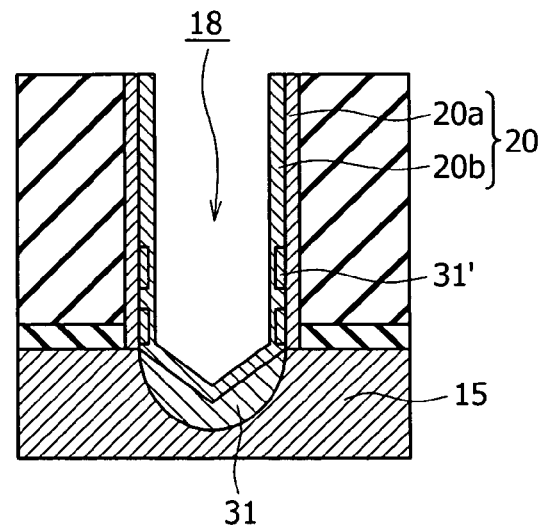

Next, as shown in FIG. 3C, a second barrier layer 20b composed of Ta, for example, is formed in a film thickness of 5 nm on the first barrier layer 20a in the state of covering the inside walls of the wiring trench 19 (see FIG. 3B) and the connection hole 18 by, for example, a sputtering method or a CVD method. As a result, a barrier film 20 composed of the first barrier layer 20a and the second barrier layer 20b is formed. It should be noted that only the second barrier layer 20a is provided at the bottom portion of the connection hole 18.

Here, it is preferable for the second barrier layer 20b to contain the same metallic material as the second metallic material constituting the alloy layer 31, like the barrier film 20 described in the first embodiment. Here, in view of the use of Ta as the second metallic material, the second barrier layer 20b is composed of Ta. As a result of such a material selection, the scattered matter 31' scattered from the alloy layer 31 to be deposited on the first barrier layer 20a and the second barrier layer 20b formed on the first barrier layer 20a contain the same material, and, therefore, the lowering in the adhesion between the first barrier layer 20a and the second barrier layer 20b is restrained, as compared with the case where the scattered matter is Cu as described in the Background of the Invention.

Further, since the side wall of the connection hole 18 is in the state where the recesses and projections due to the scattered matter 31' are suppressed and since oxidation of the scattered matter 31' is prevented, the growth of the second barrier layer 20b is not hindered, and the second barrier layer 20b can be formed with good coverage in the state of covering the inside wall of the connection hole 18 through the first barrier layer 20a therebetween.

The subsequent steps are carried out in the same manner as in the first embodiment described referring to FIGS. 1H to 1I above, an upper layer wiring 22 is formed in the wiring trench 19 through the barrier film 20 therebetween, and the via 23 is formed in the connection hole 18.

In the method of manufacturing a semiconductor device and the semiconductor device as above, also, after the formation of the first barrier layer 20a in the state of covering the inside wall of the connection hole 18, the alloy layer 31 composed of the CuTa alloy is formed on the surface side of the lower layer wiring 15 at the bottom portion of the connection hole 18, and the alloy layer 31 is subjected to sputter etching together with the first barrier layer 20a. As a result of this, the scattered matter 31' composed of the CuTa alloy is deposited on the first barrier layer 20a covering the side wall of the connection hole 18; therefore, since the CuTa alloy is less liable to aggregation and oxidation than elemental Cu, bad coverage of the second barrier layer 20b is restrained, as compared with the case where elemental Cu is scattered.

In addition, since the alloy layer 31 is provided on the surface side of the lower layer wiring 15 in the region of joint to the via 23, migration of Cu constituting the lower layer wiring 15 is suppressed, and EM durability and SM durability can be enhanced. Therefore, the same effects as in the first embodiment are displayed.

Incidentally, in this embodiment, description has been made of an example in which the alloy layer 31 is formed by introducing Ta to the surface side of the lower layer wiring 15 at the bottom portion of the connection hole 18 by the ion implantation method in the same manner as in the first embodiment. However, the present invention is not limited to this example; for example, a method may be adopted in which in the step described using FIG. 3A, the first barrier layer 20a is formed in the state of containing the second metallic material, and then a heat treatment is conducted, whereby the second metallic material constituting the first barrier layer 20a is diffused to the surface side of the lower layer wiring 15 to thereby form the alloy layer 31. In this case, in consideration of the heat resistance of Cu used for the lower layer wiring 15 and the layer insulation film 17, the heat treatment is preferably carried out at a temperature of not more than 400° C.

Third Embodiment

In the next place, a third embodiment of the method of manufacturing a semiconductor device according to the present invention will be described referring to manufacturing step sectional diagrams shown in FIGS. 4A to 4C. Incidentally, the steps up to the step of forming the etching stopper film 16 composed, for example, of SiCN on the lower layer wiring 15 and on the layer insulation film 12 as has been described using FIG. 1A in the first embodiment are carried out in this embodiment in the same manner as in the first embodiment.

Figure 4A:
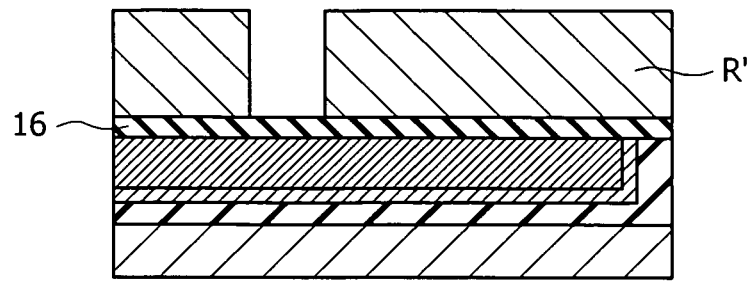
FIGS. 4A to 4C are manufacturing step sectional diagrams for illustrating a third embodiment of the method of manufacturing a semiconductor device according to the present invention.

First, as shown in FIG. 4A, a chemically amplified ArF resist, for example, is applied to the etching stopper film 16, and thereafter a resist mask R' provided with a pattern for a connection hole to be formed in the layer insulation film on the etching stopper film 16 in a later step is formed by an ordinary lithographic technique.

Figure 4B:
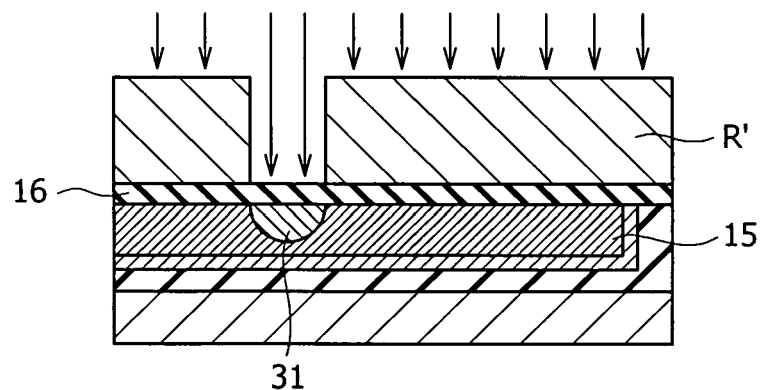

Next, as shown in FIG. 4B, using the resist mask R' as a mask, a metallic material consisting of Ta is introduced to the surface side of the lower layer wiring 15 through the etching stopper film 16 exposed at the bottom portion of the connection hole 18 by an ion implantation method under the same conditions as in the first embodiment. As a result, an alloy layer 31 is formed in a film thickness of 30 nm on the surface side of the lower layer wiring 15 to be a bottom portion of a connection hole to be formed in a later step. Thereafter, the resist mask R' is removed by ashing conducted using an $O_2$-based gas.

Figure 4C:
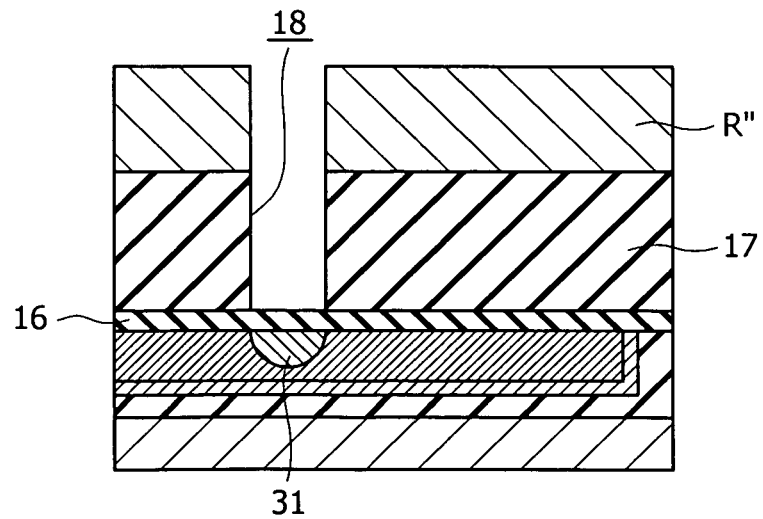

Subsequently, as shown in FIG. 4C, a layer insulation film 17 composed of MSQ, for example, is formed on the etching stopper film 16, then a chemically amplified ArF resist, for example, is applied to the layer insulation film 17, and a connection hole pattern with a diameter of 140 nm, for example, is formed in the resist by an ordinary lithographic technique, to thereby form a resist mask R". In this case, an aperture portion of the resist mask R" is so regulated to be located on the alloy layer 31.

Next, the layer insulation film 17 is provided with a connection hole 18 in the state of reaching the etching stopper film 16 by dry etching conducted using the resist mask R" as a mask and using a CF-based gas. Thereafter, the resist mask R" is removed by ashing under a low pressure condition by use of an $O_2$-based gas.

The subsequent steps are carried out in the same manner as the steps described above using FIGS. 1B to 1I in the first embodiment. Namely, the layer insulation film 17 is provided with a wiring trench 19 communicated with the connection hole 18, and then the etching stopper film 16 exposed at the bottom portion of the connection hole 18 is removed, to expose the alloy layer 31 provided on the surface side of the lower layer wiring 15. Thereafter, the alloy layer 31 thus exposed is cleaned with an organic cleaning liquid.

Subsequently, the alloy layer 31 is dug, to bring the connection hole 18 into the state of reaching the inside of the lower layer wiring 15. Thereafter, a barrier film 20 is formed in the state of covering the inside walls of the wiring trench 19 and the connection hole 18, an upper layer wiring 22 is formed in the wiring trench 19, and a via 23 is formed in the connection hole 18.

In the method of manufacturing a semiconductor device and the semiconductor device as just described above, also, the alloy layer 31 composed of CuTa is formed on the surface side of the lower layer wiring 15 to be the bottom portion of the connection hole 18, and, hence, the same effects as in the first embodiment can be displayed.

Incidentally, in this embodiment, description has been made of an example in which the steps described using FIGS. 1D to 1I in the first embodiment are carried out after the step of forming the connection hole 18 in the layer insulation film 17 described referring to FIG. 4C. However, the present invention is not limited to this example. For example, a method may be adopted in which, after the step described using FIG. 4C, the layer insulation film 17 is provided with a wiring trench in the state of being communicated with the connection hole 18, and the first barrier layer 20a is formed in the state of covering the inside walls of the wiring trench and the connection hole 18, as shown in FIG. 3A in the second embodiment. Thereafter, a procedure may be adopted in which the first barrier layer 20a and the alloy layer 31 are sputter etched, and then the second barrier layer 20b is formed on the first barrier layer 20a in the state of covering the inside walls of the wiring trench and the connection hole 18, as shown in FIG. 3C.

MODIFIED EXAMPLE 2

Incidentally, while an example in which the alloy layer 31 is formed by the ion implantation method has been described in the third embodiment above, the alloy layer 31 may be formed by a heat treatment. This case will be described referring to manufacturing step sectional diagrams shown in FIGS. 5A to 5C. Incidentally, the steps up to the step of forming on the etching stopper film 16 the resist mask R' provided with the connection pattern are carried out in the same manner as in the third embodiment.

Figure 5A:
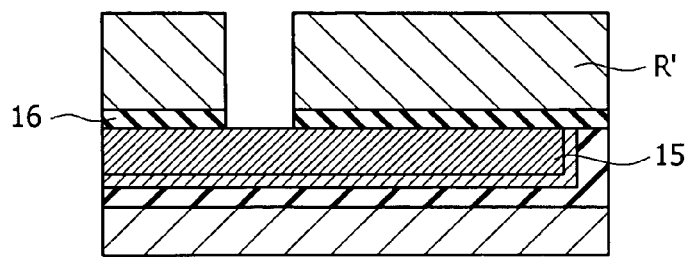
FIGS. 5A to 5E are manufacturing step sectional diagrams for illustrating Modified Example 2 of the third embodiment of the method of manufacturing a semiconductor device according to the present invention.

First, as shown in FIG. 5A, the etching stopper film 16 is removed by etching conducted using the resist mask R' as a mask and using a CF-based gas, to thereby expose a lower layer wiring 15 communicated with a bottom portion of a connection hole to be formed in a layer insulation film on the etching stopper film 16 in a later step. As a result, the etching stopper film 16 is provided with a connection hole pattern, and will serve as a mask in forming an alloy layer on the surface side of the lower layer wiring 15 by a heat treatment in a later step.

Figure 5B:
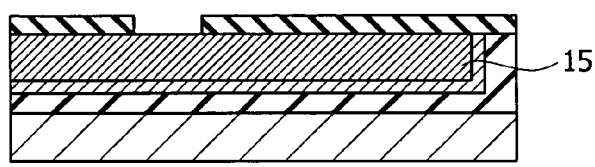

Thereafter, as shown in FIG. 5B, the resist mask R' (see FIG. 6A) is removed by an $O_2$-based gas, and then the surface of the lower layer wiring is cleaned with an organic cleaning liquid.

Figure 5C:
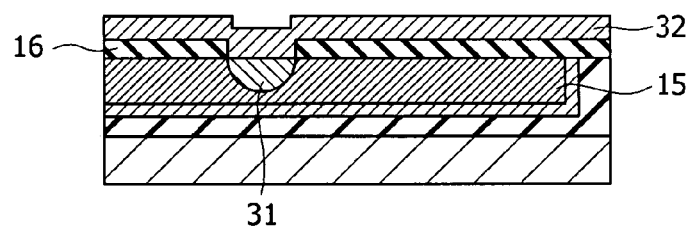

Next, as shown in FIG. 5C, a metal-containing film 32 composed of Ta, for example, is formed in a thickness of 50 nm on the etching stopper film 16 inclusive of the area on the lower layer wiring 15 by, for example, a sputter etching method. Subsequently, a heat treatment is conducted at 350° C. for 30 min, to diffuse Ta to the surface side of the lower layer wiring 15 exposed from the etching stopper film, whereby an alloy layer 31 composed of a CuTa alloy is formed. In this case, the heat treatment is preferably carried out at a temperature of not more than 400° C., in consideration of the heat resistance of Cu used for the lower layer wiring 15. In addition, the temperature in the heat treatment and the thickness of the metal-containing film 32 are so regulated that the metal-containing film 32 will be left as a Ta film on the alloy layer 31 after the heat treatment. With the Ta film thus left, diffusion of Cu from the alloy layer 31 into the layer insulation film is prevented from occurring at the time of forming the layer insulation film on the metal-containing film 32 and on the etching stopper film 16 in a later step.

Figure 5D:
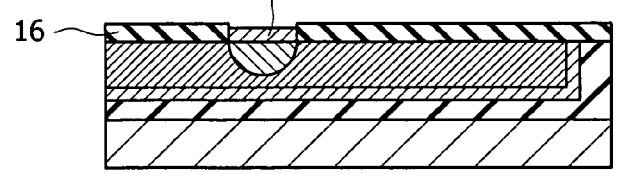

Next, as shown in FIG. 5D, a metallic material film 32 is removed by, for example, a CMP method until the surface of the etching stopper film 16 is exposed. Here, the CMP method is used because SiCN constituting the etching stopper film 16 and Ta are high in selectivity by the CMP method.

Figure 5E:
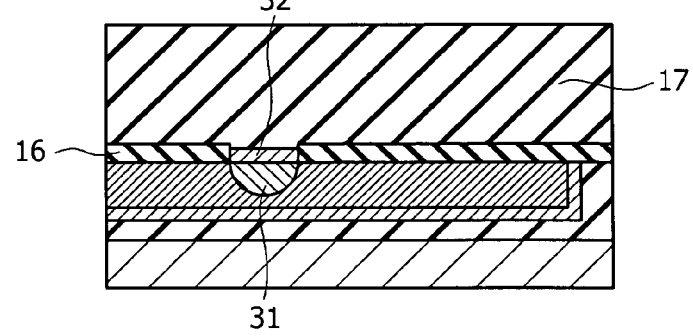

Subsequently, as shown in FIG. 5E, a layer insulation film 17 is formed on the metallic material film 32 and on the etching stopper film 16. The subsequent steps are carried out in the same manner as in the third embodiment.

In the method of manufacturing a semiconductor device and the semiconductor device as just described above, also, the alloy layer 31 composed of CuTa is formed on the surface side of the lower layer wiring 15 to be the bottom portion of the connection hole 18, and, therefore, the same effects as in the first embodiment can be displayed.

MODIFIED EXAMPLE 3

Incidentally, while an example in which the alloy layer 31 is formed by the ion implantation method has been described in the third embodiment above, the alloy layer 31 may also be formed by a filling-up method. An example in this case will be described referring to FIGS. 6A to 6E. Incidentally, the steps up to the step of forming the resist mask R' on the etching stopper film 16 are carried out in the same manner as in the third embodiment.

Figure 6A:
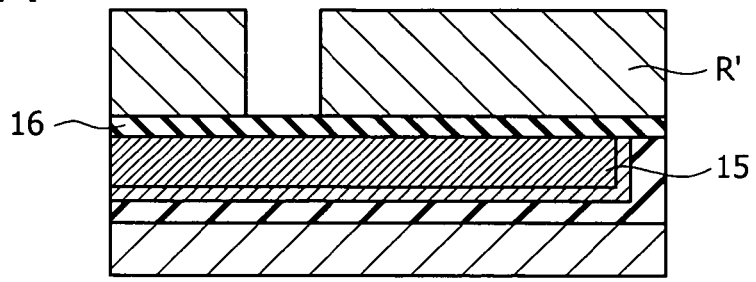
FIGS. 6A to 6E are manufacturing step sectional diagrams for illustrating Modified Example 3 of the third embodiment of the method of manufacturing a semiconductor device according to the present invention.

First, as shown in FIG. 6A, the etching stopper film 16 is removed by etching conducted using the resist mask R' as a mask and using a CF-based gas, to thereby expose a lower layer wiring 15 communicated with a bottom portion of a connection hole to be formed in a layer insulation film on the etching stopper film 16 in a later step.

Figure 6B:
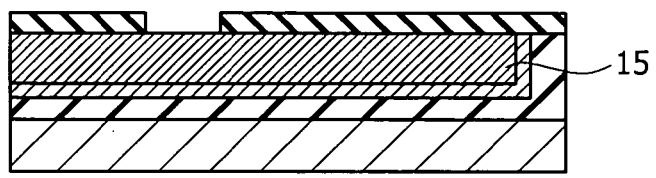

Thereafter, as shown in FIG. 6B, the resist mask R' (see FIG. 7A) is removed by an $O_2$-based gas, and then the surface of the lower layer wiring 15 is cleaned with an organic cleaning liquid.

Figure 6C:
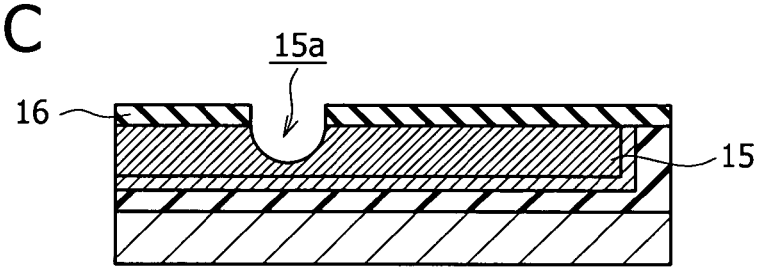

Next, as shown in FIG. 6C, wet etching is conducted using the etching stopper film 16 provided with the connection hole pattern therein as a mask, whereby a recessed portion 15a with a depth of 30 nm, for example, is formed on the surface side of the lower layer wiring 15 exposed from the etching stopper film 16.

Figure 6D:
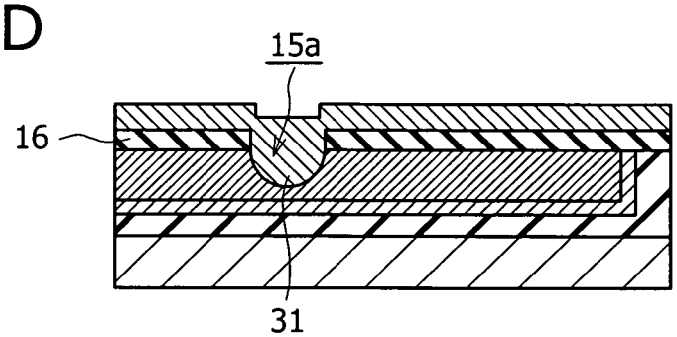

Subsequently, as shown in FIG. 6D, an alloy layer 31 composed of Cu and Ta, which constitute the lower layer wiring 15, is formed on the etching stopper film 16 in the state of filling up the recessed portion 15a by, for example, a sputtering method or a CVD method.

Figure 6E:
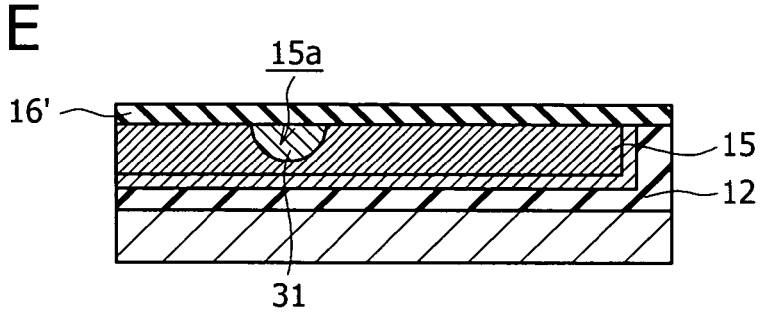

Next, as shown in FIG. 6E, the alloy layer 31 and the etching stopper film 16 (see FIG. 6D) are removed by, for example, a CMP method until the surfaces of the lower layer wiring 15 and the layer insulation film 12 are exposed. Thereafter, an etching stopper film 16' composed of SiCN, for example, is again formed in a thickness of 50 nm on the lower layer wiring 15, provided with the alloy layer 31 in its recessed portion 15a, and on the layer insulation film 12. This ensures that, even when the alloy layer 31 is left unpolished on the etching stopper film 16, diffusion of Cu into a layer insulation film formed on the etching stopper film 16' is prevented by removing the etching stopper film 16 and again forming the etching stopper film 16'.

The subsequent steps are carried out in the same manner as in the third embodiment.

In the method of manufacturing a semiconductor device and the semiconductor device as just described above, also, the alloy layer 31 composed of CuTa is formed on the surface side of the lower layer wiring 15 to be the bottom portion of the connection hole 18, and, hence, the same effects as in the first embodiment can be displayed.

While examples in which the lower layer wiring 15 and the upper layer wiring 22 and the via 23 are formed of Cu have been described in the first to third embodiments above, the present invention is not limited to these examples, and silver (Ag), gold (Au), or aluminum (Al) may be used in place of Cu. In addition, while examples in which the upper layer wiring 22 and the via 23 are formed in the wiring trench 19 and the connection hole 18 through the barrier film 20 therebetween have been described, the barrier film 20 may not necessarily be interposed in the case where the wiring and the via are formed of such materials as not to be diffused into the layer insulation film. Even in the case where the barrier film 20 is not provided, provision of the alloy layer 31 on the surface side of the lower layer wiring 15 in the region to be the bottom portion of the connection hole 18 prevents the recesses and projections from being generated due to aggregation of the scattered matter 31' deposited on the side wall of the connection hole 18, and, therefore, the fill-up characteristic in the case of filling up the connection hole 18 with a wiring material is enhanced.

Besides, while examples in which the layer insulation film 17 is a low dielectric constant film composed of MSQ have been described in the above embodiments, other low dielectric constant films may be adopted, and $SiO_2$ may be used. It should be noted, however, that in the case where a porous low dielectric constant film such as MSQ is used for the layer insulation film 17, the layer insulation film 17 is liable to absorb moisture, and the lower layer wiring material deposited on the side wall of the connection hole 18 at the time of sputter etching is also liable to oxidation; therefore, the present invention is preferably applied to such a case. In addition, in the case where the diameter of the connection hole 18 is not more than 150 nm, a problems is liable to be generated as to the coverage of the barrier film 20 formed in the state of covering the inside wall of the connection hole 18, and, therefore, the present invention is preferably applied to such a case.

Besides, Modified Example 1 of the first embodiment is applicable also to the second and third embodiments and Modified Examples 2 and 3.

EXAMPLES

Further, specific examples of the present invention will be described.

As Example 1, a semiconductor device was manufactured by the manufacturing method described in the first embodiment above. In addition, as Example 2, a semiconductor device was manufactured by the manufacturing method described in the second embodiment above. As Example 3, a semiconductor device was manufactured by the manufacturing method described in the third embodiment above. Besides, as Example 4, a semiconductor device was manufactured by the manufacturing method described in Modified Example 2 of the third embodiment above. Further, as Example 5, a semiconductor device was manufactured by the manufacturing method described in Modified Example 3 of the third embodiment above.

Figure 9:
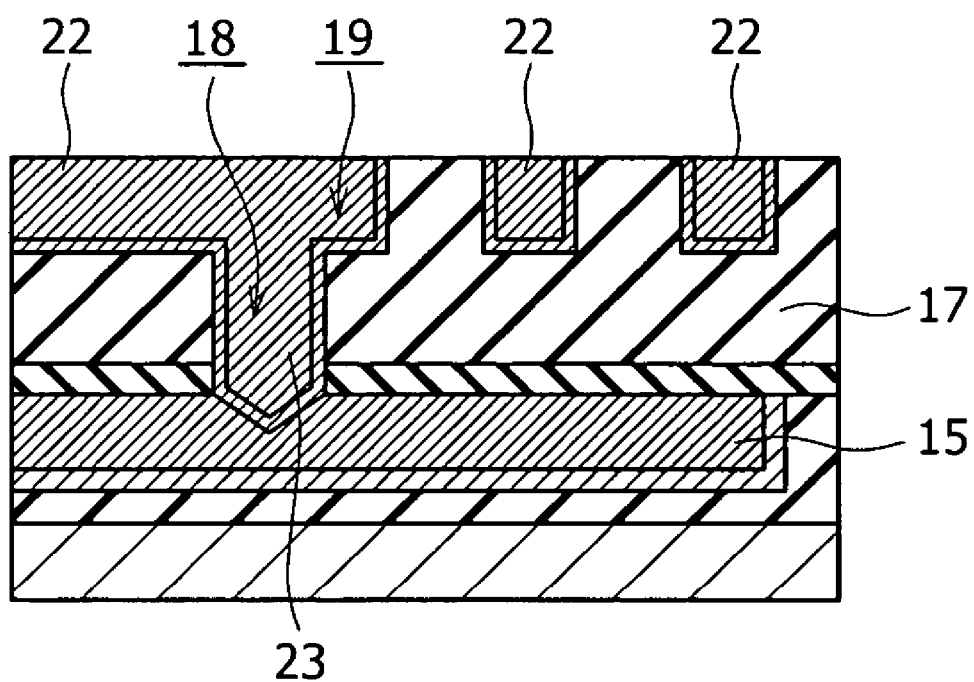
FIG. 9 is a manufacturing step sectional diagram (No. 3) for illustrating the method of manufacturing a semiconductor device according to the related art.

On the other hand, as Comparative Example 1 in contrast to the above Examples, a semiconductor device was manufactured by the manufacturing method shown in FIGS. 8 to 9 described in the Background of the Invention. This manufacturing method is the same as the manufacturing method of Example 1, except that the alloy layer 31 is not formed.

Figure 10A:
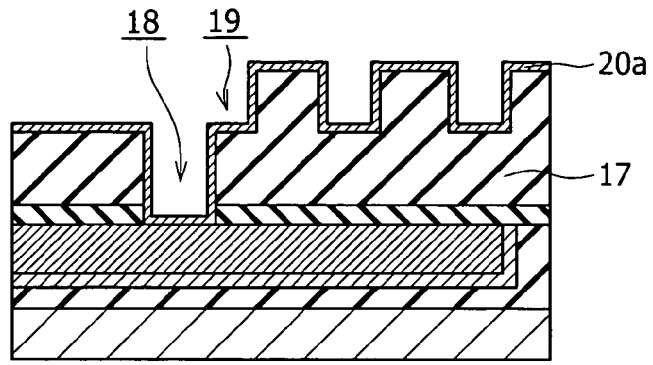
FIGS. 10A to 10C are manufacturing step sectional diagrams (No. 4) for illustrating the method of manufacturing a semiconductor device according to the related art.
Figure 10B:
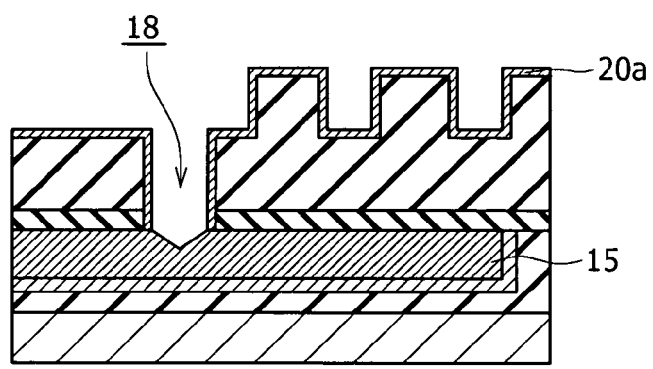
Figure 10C:
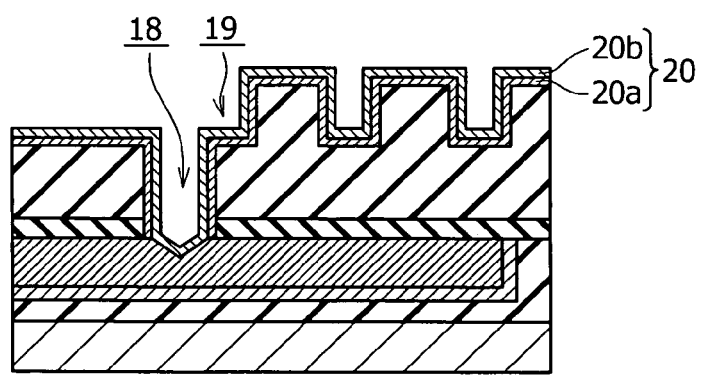

In addition, as Comparative Example 2 in contrast to the above Examples, a semiconductor device was manufactured by the manufacturing method shown in FIGS. 10A to 10C described in the Background of the Invention. This manufacturing method is the same as the manufacturing method of Example 2, except that the alloy layer 31 is not formed.

Figure 7A:
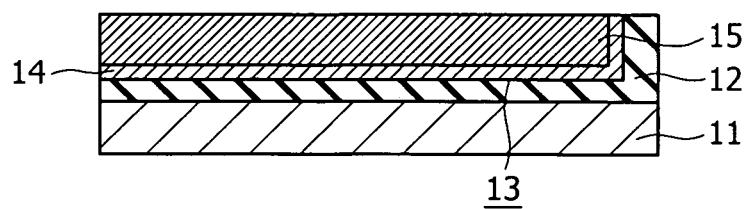
FIGS. 7A to 7C are manufacturing step sectional diagram for illustrating Comparative Example in comparison to the examples of the method of manufacturing a semiconductor device according to the present invention.
Figure 7B:
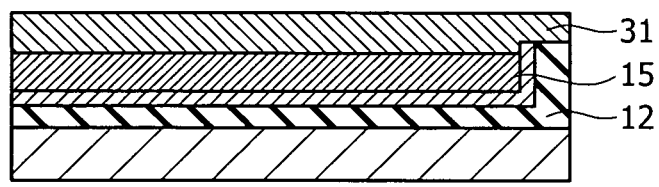
Figure 7C:
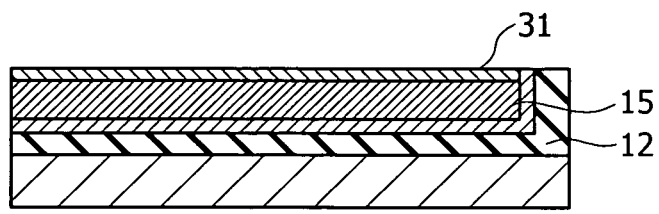
Figure 8A:
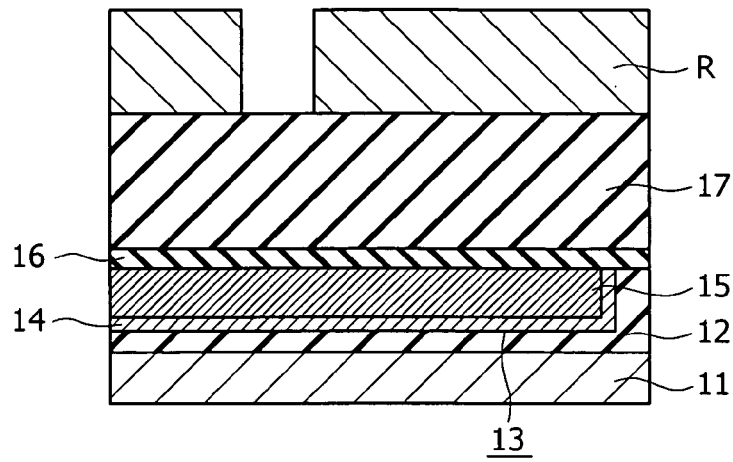
FIGS. 8A to 8C are manufacturing step sectional diagrams (No. 1) for illustrating a method of manufacturing a semiconductor device according to the related art.
Figure 8B:
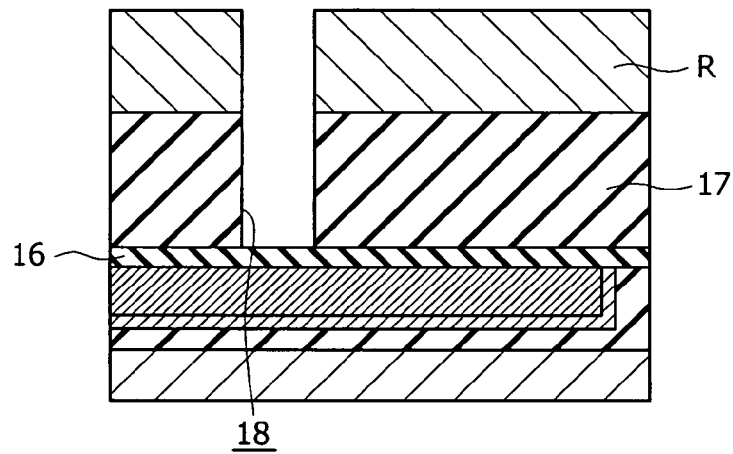
Figure 8C:
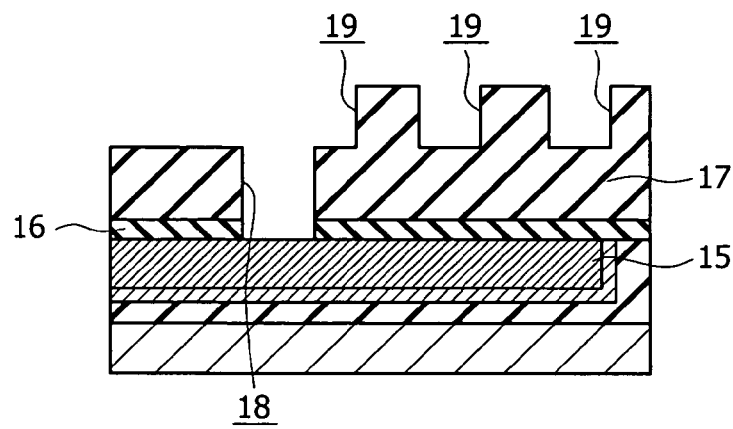
Figure 8D:
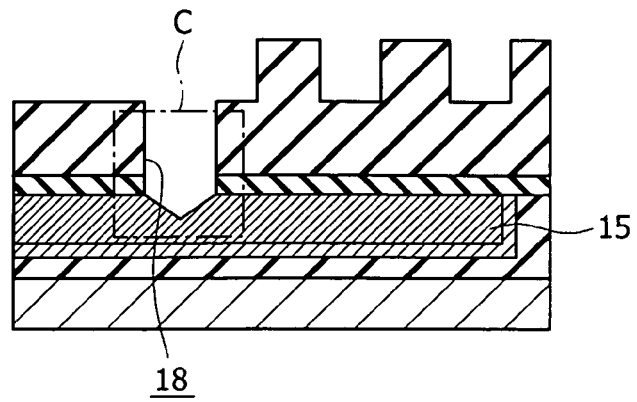
FIGS. 8D to 8F are manufacturing step sectional diagrams (No. 2) for illustrating the method of manufacturing a semiconductor device according to the related art.
Figure 8E:
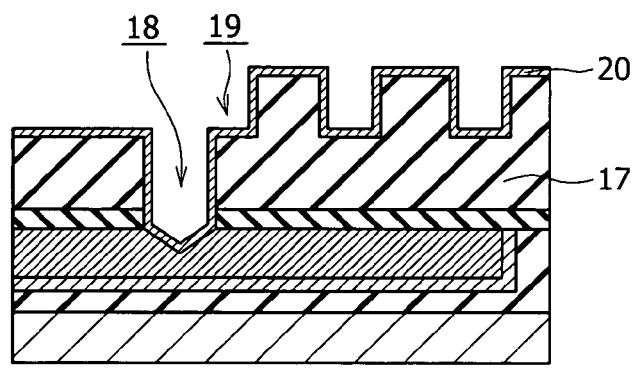
Figure 8F:
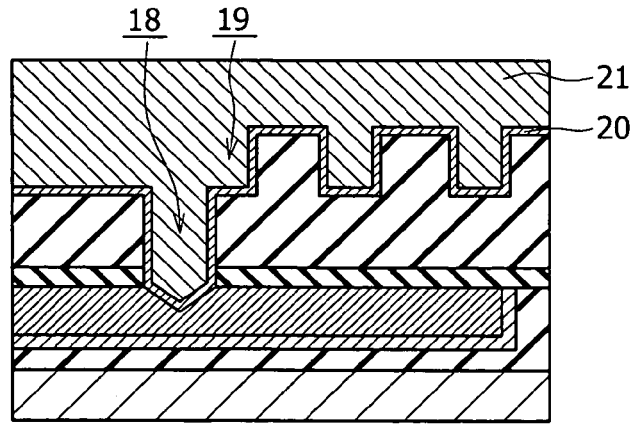

Furthermore, as Comparative Example 3 in contrast to the above Examples, a semiconductor device provided with the alloy layer 31 over the entire region of the surface of the lower layer wiring 15 was manufactured by the method as shown in FIGS. 7A to 7C. First, as shown in FIG. 7A, a lower layer wiring 15 composed of Cu was formed in a thickness of 200 nm in a wiring trench 13 provided in a layer insulation film 12 on a substrate 11, through a barrier film 14 therebetween.

Next, as shown in FIG. 7B, the surface side of the lower layer wiring 15 was removed in a depth of 30 nm by wet etching, and an alloy layer 31 composed of a CuTa alloy was formed in a film thickness of 100 nm on the lower layer wiring 15 and on the layer insulation film 12.

Thereafter, as shown in FIG. 7C, the alloy layer 31 was removed by a CMP method until the layer insulation film 12 was exposed, and a lower layer wiring 15 provided with the alloy layer 31 on the surface side was formed. The subsequent steps were carried out according to the manufacturing method shown in FIGS. 8 to 9 described in the Background of the Invention above, whereby a semiconductor device provided with the alloy layer 31 over the entire region on the surface side of the lower layer wiring 15.

For the semiconductor devices manufactured in Examples 1 to 5 and Comparative Examples 1-3, the shape of the via 23 was confirmed, and reliability tests as to EM durability, SM durability and the like were carried out. Furthermore, resistance was measured.

As a result, in the semiconductor devices manufactured in Examples 1 to 5, generation of voids in the via 23 was not observed, and sufficient durability was confirmed in the reliability tests as to SM durability, EM durability and the like. As for wiring resistance, a rise of about 2% was confirmed, as compared with the semiconductor devices of Comparative Examples 1 and 2 not provided with the alloy layer 31, but the semiconductor devices were in an allowable range.

Figure 11A:
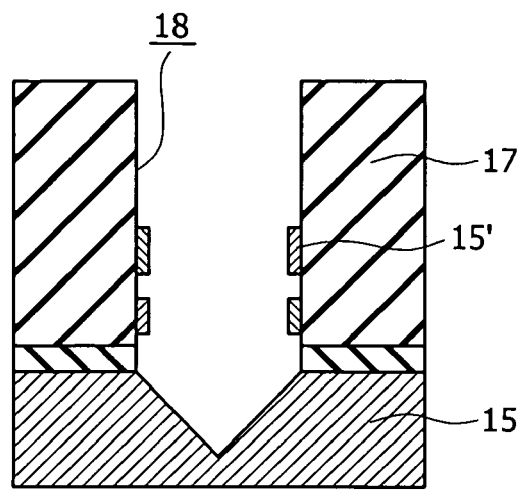
FIGS. 11A to 11C are sectional diagrams (No. 1) for illustrating a problem in the method of manufacturing a semiconductor device according to the related art.
Figure 11B:
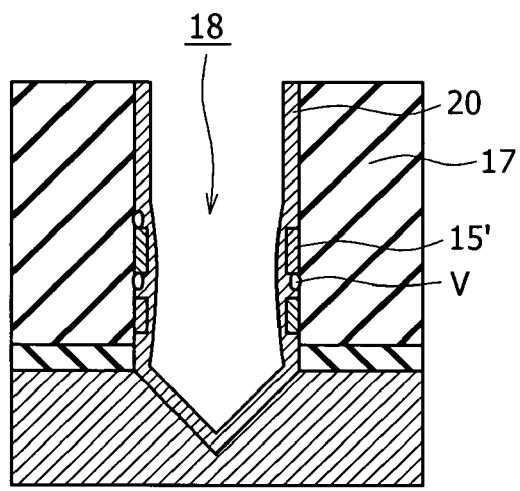
Figure 11C:
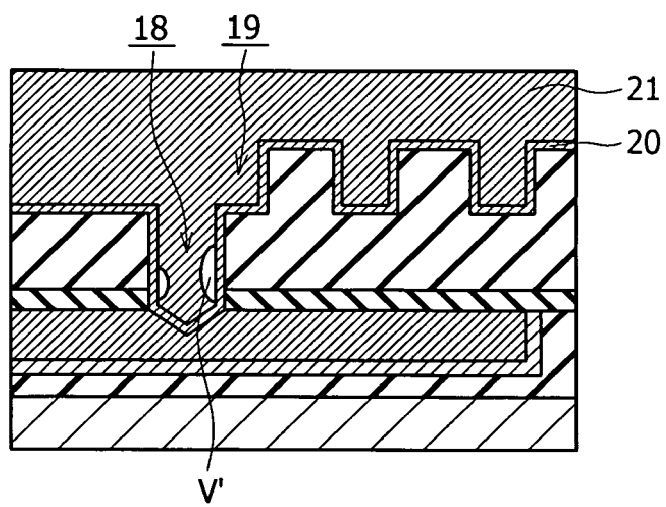
Figure 12:
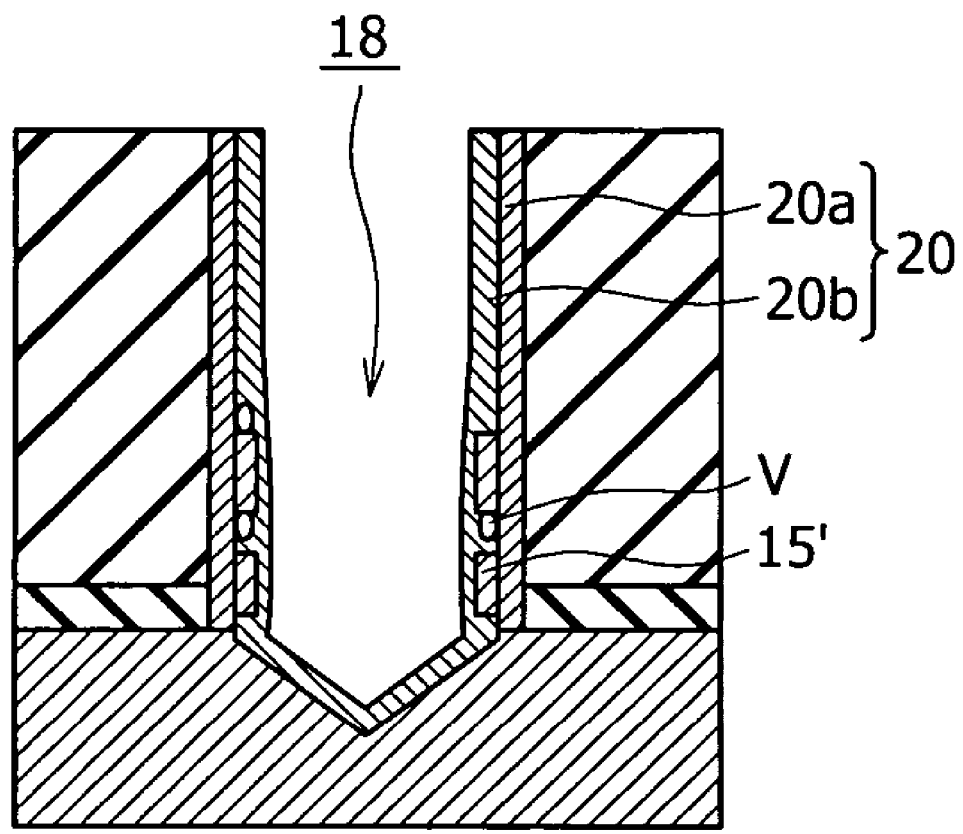
FIG. 12 is a sectional diagram (No. 2) for illustrating the problem in the method of manufacturing a semiconductor device according to the related art.

On the other hand, in the semiconductor device of Comparative Example 1, a large void V' as shown in FIG. 11C was confirmed to be present in the via 23, and lowerings in EM durability and SM durability were confirmed. In the semiconductor device of Comparative Example 2, voids in the via were slightly reduced as compared with the semiconductor device of Comparative Example 1, but lowerings in EM durability and SM durability were confirmed. In the semiconductor device of Comparative Example 3, voids in the via 23 were not confirmed, and sufficient durability was confirmed in the reliability tests as to EM durability and SM durability, but a rise in wiring resistance of not less than 30% was confirmed as compared with the semiconductor device of Example 1, whereby it was confirmed that the semiconductor device is not applicable as a semiconductor device.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising:
    a first step of forming an insulation layer over a substrate having a metal wiring made of a first metallic material thereon, and then forming a connection hole in said insulation layer;
    a second step of forming, by ion implantation, an alloy layer in said metal wiring located underneath said connection hole with a second metallic material different from said first metallic material;
    a third step of sputter-etching said alloy layer causing said connection hole to reach said metal wiring; and
    a fourth step of forming a via in said connection hole, such that the via penetrates said metal wiring and said connection hole reaches said metal wiring.

2. The method of manufacturing a semiconductor device as set forth in claim 1, wherein in said second step, said alloy layer is formed by an ion implantation process.

3. The method of manufacturing a semiconductor device as set forth in claim 1, wherein in said second step, a film containing said second metallic material is formed on said insulation layer such that said film covers the inner wall of said connection hole, and said alloy layer is formed by a heat treatment.

4. The method of manufacturing a semiconductor device as set forth in claim 1, wherein in said third step, said alloy layer is sputter etched so as to leave said alloy layer on the surface of said metal wiring.

5. The method of manufacturing a semiconductor device as set forth in claim 1, wherein in said third step, said alloy layer is dug such that said connection hole extends into a portion of said metal wiring.

6. The method of manufacturing a semiconductor device as set forth in claim 1, wherein, a barrier film containing a second metallic material is formed between said third step and said fourth step, said barrier film covering the inside wall of said connection hole and preventing diffusion of metal from said via into said insulation layer; and in said fourth step, forming said via inside of said connection hole through said barrier layer.

7. A method of manufacturing a semiconductor device, comprising:

a first step of forming a metal wiring made of a first metallic material over a substrate, forming a mask having a connection hole pattern, said mask covering said metal wiring, and forming an alloy layer, by ion implantation in said metal wiring and a second metallic material different from said first metallic material;

a second step of forming an insulation layer, on exposed surfaces of said metal wiring or on said mask, including said exposed surfaces of said metal wiring, and forming a connection hole inside said insulation layer that reaches said alloy layer;

a third step of sputter-etching said alloy layer; and a fourth step of forming a via in said connection hole, such that the via penetrates said metal wiring and said connection hole reaches said metal wiring.

8. The method of manufacturing a semiconductor device as set forth in claim 7, wherein in said first step, said alloy layer is formed by an ion implantation process.

9. The method of manufacturing a semiconductor device as set forth in claim 7, wherein in said first step, a film containing said second metallic material is formed on said mask including exposed surfaces of said metal wiring, and said alloy layer is formed by a heat treatment that diffuses said second metallic material to the exposed surfaces of said metal wiring.

10. The method of manufacturing a semiconductor device as set forth in claim 7, wherein in said first step, etching forms a recessed portion on the exposed surface of said metal wiring, and thereafter said recessed portion is filled up with said alloy layer.

11. The method of manufacturing a semiconductor device as set forth in claim 7, wherein in said third step, said alloy layer is sputter etched so as to leave said alloy layer on the surface of said metal wiring.

12. The method of manufacturing a semiconductor device as set forth in claim 7, wherein in said third step, said alloy layer is dug such that said connection hole extends into a portion of said metal wiring.

13. The method of manufacturing a semiconductor device as set forth in claim 7, wherein, a barrier film containing a second metallic material is formed between said third step and said fourth step, said barrier film covering the inside wall of said connection hole and preventing diffusion of metal from said via into said insulation layer; and in said fourth step, forming said via inside of said connection hole through said barrier film.

\* \* \* \* \*